United States Patent [19]

Winters

[11] 4,095,185
[45] June 13, 1978

[54] ELECTRICAL ENERGY TRANSMISSION NETWORK

[76] Inventor: Paul N. Winters, P.O. Box 327, Trumann, Ark. 72472

[21] Appl. No.: 787,373

[22] Filed: Apr. 14, 1977

[51] Int. Cl.² ........................................... H03K 5/159
[52] U.S. Cl. ..................................... 328/55; 328/155; 329/145
[58] Field of Search ................... 328/155, 55; 329/145

[56] References Cited

U.S. PATENT DOCUMENTS

| | | | |
|---|---|---|---|
| 3,392,337 | 7/1968 | Neuburger | 329/145 |
| 3,538,446 | 11/1970 | Leonard | 328/155 |
| 3,851,256 | 11/1974 | Leuasseur et al. | 328/55 |
| 4,039,930 | 8/1977 | Lukas | 328/155 |

Primary Examiner—John S. Heyman
Attorney, Agent, or Firm—Clarence A. O'Brien; Harvey B. Jacobson

[57] ABSTRACT

The delay elements of a signal energy transmission network are divided into separate portions through which the transmitted energy is phase shifted in sequence by substantially equal amounts. A phase correction circuit reverses the phase shift through one of the divided delay portions by doubling the frequency of the signal at a reference phase angle and subtracting therefrom the input frequency of the signal phase shifted through said one of the divided delay portions in order to maintain a constant frequency vs. phase relationship.

19 Claims, 7 Drawing Figures

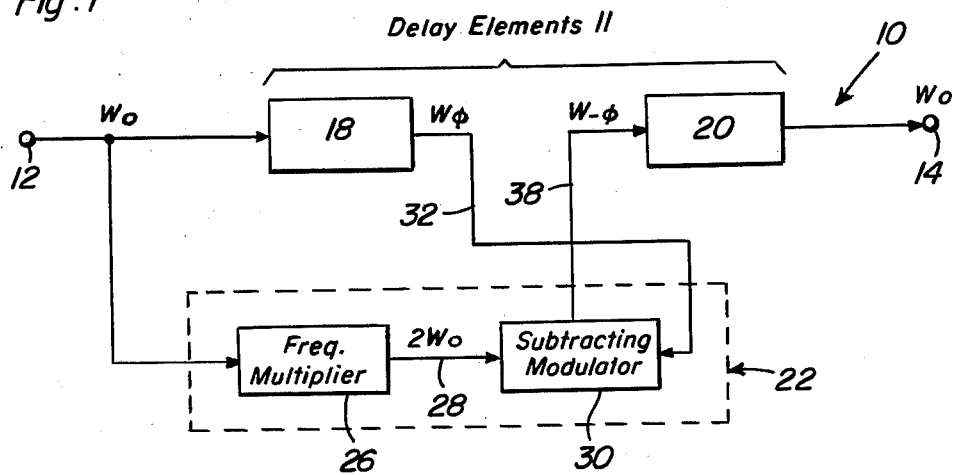
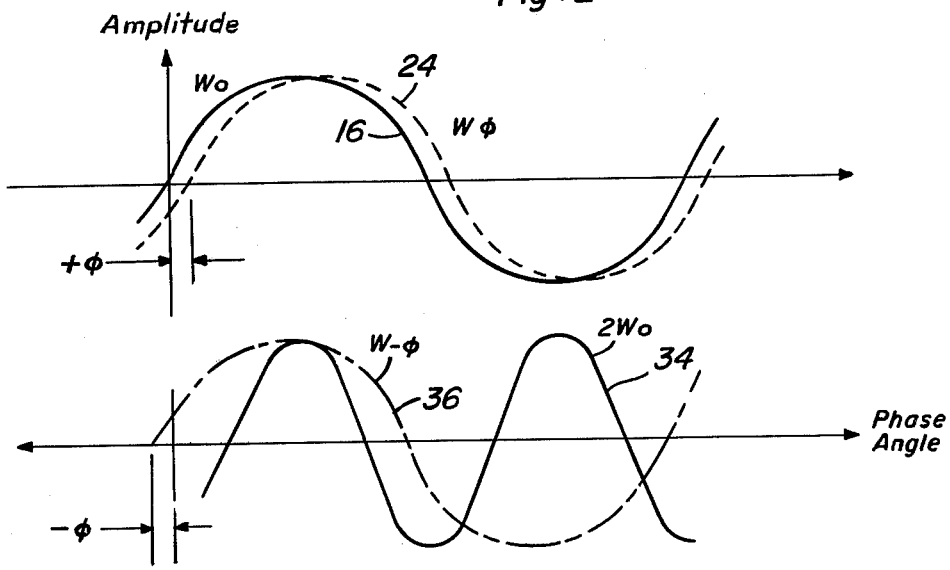
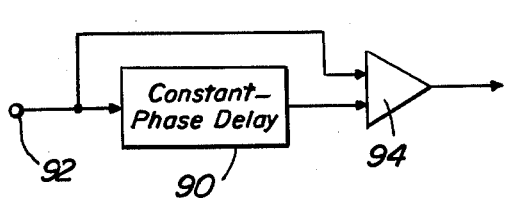
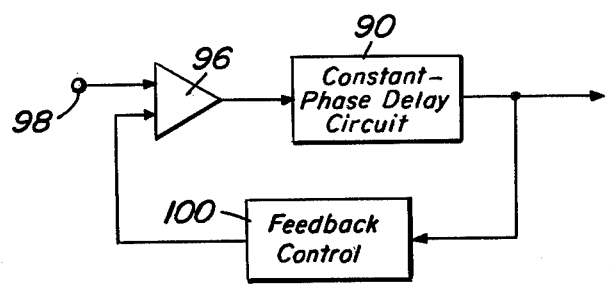

ELECTRICAL ENERGY TRANSMISSION NETWORK

BACKGROUND OF THE INVENTION

This invention relates to phase correcting circuits for energy transmission networks having delay elements therein.

There are many transmission networks through which energy is transmitted, characterized by at least one frequency component such as electrical energy having a sinusoidally varied current or voltage characteristic. Often such networks include delay elements or delay lines between spaced terminals producing a time delay be means of an energy storing action usually involving arrays of inductances and capacitors. Such time delays are accompanied by some phase shifting for any given frequency transmitted between the spaced terminals. While various phase correcting arrangements are sometimes associated with the delay elements to avoid excessive phase distortion, phase shifting does remain to a significant degree.

It is therefore an important object of the present invention to provide a technique for eliminating phase shift between terminals of an energy transmission network.

The following prior U.S. patents deemed to be relevant are known to applicant and those substantively involved in preparing this application:

U.S. Pat. No. 3,065,361, Brook, Nov. 20, 1962;
U.S. Pat. No. 3,274,497, Zimmerman, Sept. 20, 1966;
U.S. Pat. No. 3,392,337, Neuburger, July 9, 1968;
U.S. Pat. No. 3,593,106, LaFuze, July 13, 1971;
U.S. Pat. No. 3,609,509, LaFuze, Sept. 28, 1971.

Although each of the foregoing patents disclose electrical networks having delay lines therein and feedback, phase detectors, modulators and signal adding components such as those associated with the network configuration disclosed in the present application, none of the foregoing patents is addressed to nor deals with the phase correcting operation of the present invention.

SUMMARY OF THE INVENTION

In accordance with the present invention an energy transmission network having energy storing delay elements therein through which a sinusoidally varying electrical current is transmitted, is modified so as to divide the delay elements into separate delay portions through which phase shift occurs by equal amounts over a given cyclic period. The separate delay portions are interconnected in series with a frequency subtracting modulator between the input and output terminals of the network so as to effect sequential phase shift while performing the delay function. The modulator forms part of a phase correcting circuit which is operative to reverse the phase shift produced by one of the separate delay portions in order to cancel the phase shift of the other delay portion. This phase shift reversal is accomplished by doubling the input frequency of the signal at a reference phase angle through a frequency multiplier, and subtracting therefrom the signal at the input frequency after phase shift through said one of the delay portions. The transmission network so modified becomes a constant-phase delay circuit which behaves differently from ordinary delay circuits when utilized in combination with other components to perform integration operations for example.

These, together with other objects and advantages which will become subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 1 is a schematic circuit diagram showing a constant-phase delay network in accordance with the present invention for handling one class of signals.

FIG. 2 is a graphical illustration showing certain wave forms associated with the network shown in FIG. 1.

FIGS. 5, 6 and 7 are schematic circuit diagrams showing a constant-phase delay component associated with different network configurations.

DETAILED DESCRIPTION OF PREFERRED EMBODIMENTS

Figure 3:
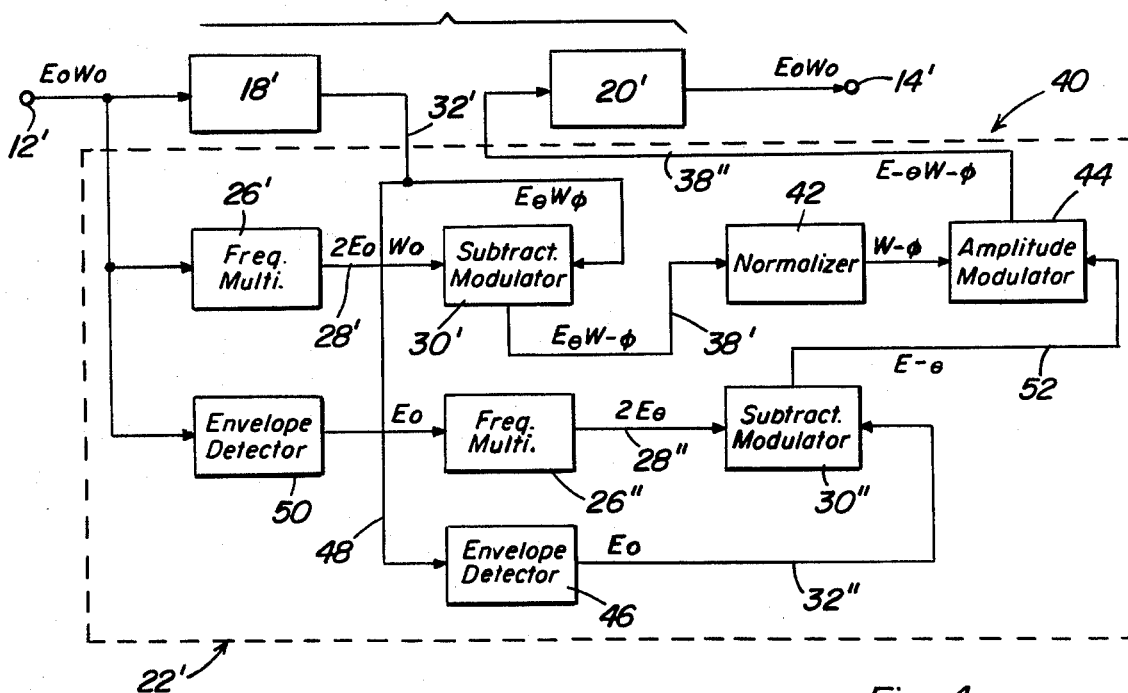
FIG. 3 is a schematic circuit diagram of another form of constant-phase delay network for handling a second class of signals.

Referring now to the drawings in detail, FIG. 1 diagrammatically illustrates one form of constant-phase delay network generally referred to by reference numeral 10 arranged in accordance with the present invention. In this type of energy transmission network, electrical signal energy that is sinusoidally varied at a single frequency is applied to the input terminal 12 of the network. A time delayed output signal is obtained at the output terminal 14 with a net change in phase substantially equal to zero. FIG. 2 shows, by way of example only, the sinusoidal input signal denoted by reference numeral 16 having a frequency index W and a reference phase angle of zero appearing as a subscript to the signal frequency designation W, assumed to change slowly as compared to the total delay period associated with divided delay portions 18 and 20 of the network. In accordance with the present invention, the delay elements 11 associated with the transmission network is divided into two portions 18 and 20 as shown in FIG. 1 interconnected in series by a phase correcting circuit generally referred to by reference numeral 22. The divided portions 18 and 20 will accordingly produce a signal delay ordinarily associated with the energy storing delay elements prior to being divided into separate portions without, however, any net change in phase of the transmitted energy. Each divided portion 18 and 20 will itself produce a change in phase in the same direction denoted by $\phi$ as indicated in FIG. 2 with respect to the phase shifted, sinusoidal signal 24. In the embodiment illustrated in FIG. 1, both divided portions 18 and 20 of the delay elements phase shift the signal by equal amounts $\phi$ for what is ordinarily a total phase shift of $2\phi$.

The phase correcting circuit 22 includes a frequency multiplier 26 of single sideband type connected in parallel with the divided delay portion 18 to the input terminal 12 of the network in order to double the input frequency at a reference phase angle. This doubled frequency signal is fed through line 28 to one input of a single-sideband type of frequency subtracting modulator 30. The phase shifted output of the divided delay portion 18 is fed through line 32 to the other input of the modulator 30 in order to subtract the input frequency of the phase shifted signal from the doubled frequency signal and thereby reverse the phase shift of the divided delay portion 18. Thus, as shown in FIG. 2, the doubled frequency signal component 34 is operative through the subtracting modulator 30 to produce a frequency component signal 36 that is phase shifted in a reverse direction by an amount $-\phi$ which appears in the output line 38 of the modulator as depicted in FIG. 1. The output of the modulator 30 is fed through line 38 to the other divided delay portion 20 of the network in which it is again phase shifted so as to produce a net change in phase equal to zero at the output terminal 14.

FIG. 3 illustrates another energy transmission network generally referred to by reference numeral 40 in which the delay elements 11' of the network are again divided into separate portions 18' and 20' between input terminal 12' and output terminal 14'. A phase correcting circuit 22' with which the network is associated, is designed to handle signal energy in another class such as complex sinusoidal signals containing more than one frequency component also assumed to change slowly as compared to the total delay period associated with divided delay portions 18' and 20' of the network. The complex sinusoidal signals include but are not necessarily limited to carrier energy modulated, for example, by speech or music. Such complex signals are regarded as including two frequency components consisting of the instantaneous frequency W and the envelope frequency E. Thus, he circuit 22' not only maintains a constant phase with respect to the instantaneous frequency W but also with respect to the envelope frequency E. The phase correcting circuit 22', as in the case of the circuit 22 depicted in FIG. 1, includes a frequency multiplier 26' connected in parallel with the divided delay portion 18' to the input terminal 12' and having an output line 28' connected to one input of a frequency subtracting modulator 30', the other input of which is connected through line 32' to the output of the first divided delay portion 18' of the delay elements. The output of the subtracting modulator 30' is connected through line 38' to a normalizer component 42 which removes amplitude variations and feeds the transmitted energy to an amplitude modulator 44. The other input to the modulator 44 is connected to the output of a second subtracting modulator 30". A doubled frequency component is fed to one input of the modulator 30" through line 28" from a second frequency multiplier 26". The other input of the modulator 30" receives a signal through line 32" from the output of an envelope detector 46 connected by line 48 to the output of the delay portion 18'. Another envelope detector 50 is connected to the input terminal 12' to supply an input signal to the frequency multiplier 26". It will be apparent, therefore, that the instantaneous input frequency at the reference phase angle ($W_0$) will be doubled through the frequency multiplier 26' and fed to the subtracting modulator 30' in order to produce a reverse phase shifted frequency $W_{-\phi}$ in its output line 38' which is fed to the modulator 44 through normalizer 42 as shown. The envelope frequency on the other hand will be detected by the detectors 50 and 46 at the input terminal 12' and in line 48, respectively. The detector 50, accordingly, will supply the envelope frequency at the reference phase angle ($E_0$) to the frequency multiplier 26" for supply of a doubled envelope frequency component to the subtracting modulator 30" while the detector 46 will supply the phase shifted envelope frequency component ($E_\Theta$) to the other input of the modulator 30' in order to produce at the output of the modulator a reverse shifted envelope frequency component ($E-\Theta$). The modulator 44 is connected to the output of modulator 30" through line 52 and accordingly produces an output in line 38" in which both frequency components are phase shifted in a reverse direction. The output line 38" of the modulator 44 being connected to the second divided delay portion 20' will, therefore, result in an output at output terminal 14' in which there is a net change in phase equal to zero with respect to both frequency components.

In using single-sideband circuitry, certain operations of the phase correcting method depicted in FIG. 3 may be combined. For example, the frequency multiplier 26" and envelope detector 50 may share 90° phase shift networks and transformers.

Figure 4:
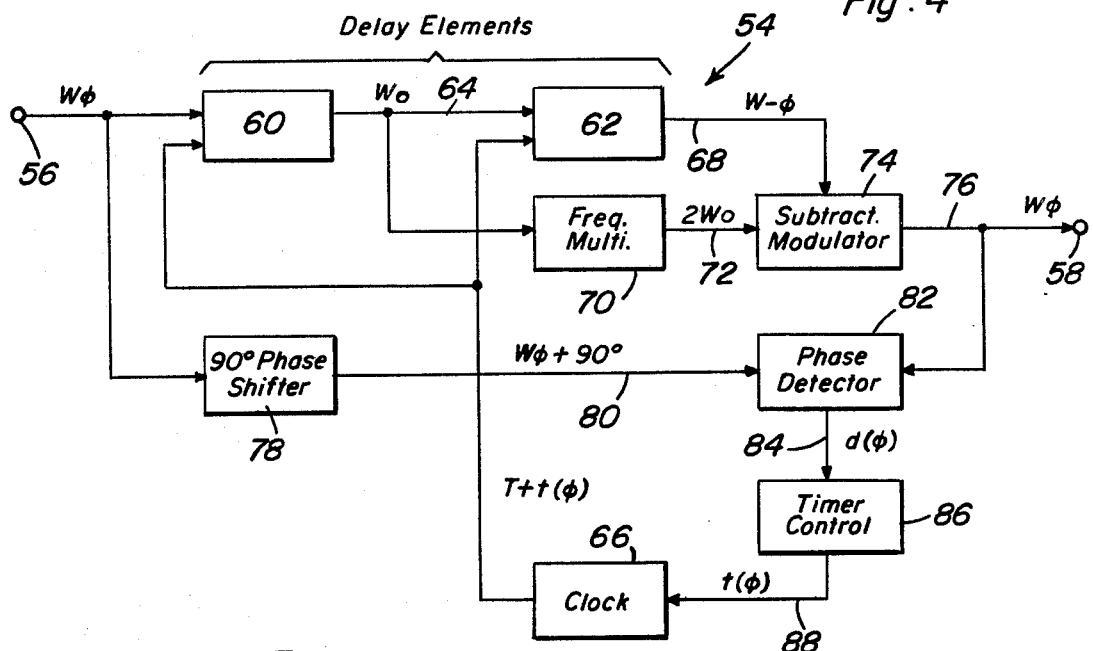
FIG. 4 is a schematic circuit diagram of yet another form of constant-phase delay network for handling a third class of signals.

Yet another class of signals may be handled in a constant-phase transmission network generally referred to in FIG. 4 by reference numeral 54. Signals containing band limited frequency or phase shift modulation may be transmitted between input and output terminals 56 and 58, through divided delay portions 60 and 62 of the delay elements associated with the network producing a predetermined delay. The divided delay portions 60 and 62 are interconnected in series through a reference signal line 64 and their delay periods are lengthened or shortened in equal amounts under control of a common clock 66 connected in parallel to the divided portions 60 and 62. A phase shifted input signal $W_\phi$ at the input terminal 56 is conducted through the divided delay portion 60 to produce a signal at the reference phase angle $W_0$ in line 64 which is then phase shifted again through divided delay portion 62 to produce an output signal in line 68 that is phase shifted with respect to the input signal by an amount $2\phi$. The signal in line 64 is supplied to a frequency multiplier 70 in order to double the frequency of the signal in line 64. The doubled frequency component is supplied through line 72 from the frequency multiplier to a subtracting modulator 74 to which the output of divided delay portion 62 is connected. An output signal $W_\phi$ in phase with the input signal is accordingly supplied from the modulator 74 to the output terminal 58 through output line 76. A 90° phase shifter 78 is connected to the input terminal in order to supply a 90° phase shifted signal through line 80 to a phase detector 82 through which the signals at the input and output terminals are compared. Any change in phase between the input and output signals will accordingly supply an error signal through line 84 to a timer control component 86. The timer control component 86 is operative through a control line 88 to operate the common clock 66 in order to change the clock frequency and thereby change the delay periods of the divided delay portions 60 and 62 by equal amounts as aforementioned.

With continued reference to the arrangement depicted in FIG. 4, when the input signal reaches a steady state value, the clock frequency of clock 66 will assume its steady state value. If a data transmission system is involved, the output signal at output terminal 58 would be sampled at that instant. The delay periods associated with the divided delay portions 60 and 62 of the delay elements would also be made the same as the data timing at the sampling times. Since the foregoing arrangement causes the envelopes of data signals to coincide, there is not need for envelope phase correction.

The technique hereinbefore described may be used to correct phase errors in any system with which the various described phase correcting operations are compatible in an open loop configuration. The transmission networks hereinbefore described may also be utilized as constant-phase delay circuits in combination with other system configurations in which the constant-phase delay circuit behaves differently from ordinary delay circuits. FIG. 5 depicts, for example, a constant-phase delay circuit 90 arranged in accordance with one of the embodiments hereinbefore described. An input signal is fed to the circuit 90 from input terminal 92 and to one input of a summing device 94, the other input being received from the output of the circuit 90. Where the summing device 94 is operative to add the input and output signals of the circuit 90 in phase, phase reversed signals of the same period as the delay will be rejected and continuous wave signals enhanced without regard to carrier frequency. Where the summing device 94 is of the differential amplifier type, output and input signals will be added in out-of-phase relationship to enhance phase reversed signals of the same period as the delay and reject continuous wave signals regardless of center frequency.

In FIG. 6, a constant-phase circuit 90 has its input connected to the output of a summing device 96 to which one input is applied from input terminal 98. The output of circuit 90 is connected through a feedback control component 100 to the other input of the summing device 96 in order to perform an integration operation. In the arrangement depicted in FIG. 6, an improvement in signal-to-noise ratio will occur if the feedback factor associated with the feedback control 100 is between unity and ⅔. Unlike ordinary delay lines the arrangement shown in FIG. 6 does not have any "comb" effect. Where the summing device 96 adds the output to the input signal in phase, integration is performed with respect to continuous wave signals. On the other hand, where the summing device 96 adds the output and input signals in out-of-phase relationship, integration is performed with respect to phase reversed signals of the same period as the total delay time. The phase reversed signals may contain information in the form of amplitude modulation.

Figure 7:
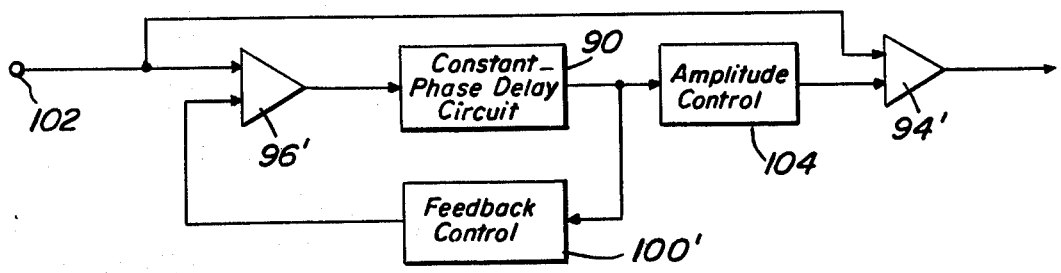

FIG. 7 illustrates a configuration which is basically a combination of those shown in FIGS. 5 and 6. Thus, the input signal in input terminal 102 is fed to one input of a summing device 96' to which a feedback signal is supplied through feedback control 100' from the output of circuit 90. The output of circuit 90 is conducted through an amplitude control 104 to one input of an output summing device 94' to which the input signal is also fed. By adding the output of circuit 90 to the input signal in phase through summing device 96', and subtracting the input from the output through device 94', the configuration shown in FIG. 7 may be utilized to remove heterodynes from speech in radio service. The steady tones will be integrated by a maximum amount whereas the speech components will be integrated to a lesser amount and will be transmitted with a suitable delay time.

The network configurations hereinbefore described may be combined or cascaded in some applications in order to attain desired results not possible in one operation. For example, the configuration illustrated in FIG. 6 may be utilized to obtain a signal gain of 1,000 with a theoretical feedback factor of 0.999. However, at certain frequencies the gain around the loop shown might exceed the limits hereinbefore indicated with respect to the invention, rendering the system unstable. In such case, three networks may be cascaded to produce a more practical system, each having a feedback factor of 0.9 to achieve the desired result.

The foregoing is considered as illustrative only of the principles of the invention and may be applied by analogy to transmission of energy other than electrical energy where phase control is a problem. For example, transmission of mechanical torque through gearing and laser operation are other physical systems to which the technique of the present invention may be applied. Further, since numerous modifications and changes will readily occur to those skilled in the art, it is not desired to limit the invention to the exact construction and operation shown and described, and accordingly all suitable modifications and equivalents may be resorted to, falling within the scope of the invention.

What is claimed as new is as follows:

1. A method of maintaining a substantially constant phase relationship between transmitted energy at input and output terminals of an energy transmission network having energy storing delay elements producing a change in phase of the transmitted energy with respect to an input frequency thereof, including the steps of: dividing the energy storing delay elements into separate delay portions respectively producing changes in phase of the transmitted energy; passing the transmitted energy through said divided delay portions in sequence to phase shift the transmitted energy; doubling the input frequency of the transmitted energy at a reference phase angle; and subtracting the input frequency of the transmitted energy passed through only one of the divided delay portions from the doubled frequency at said reference phase angle to reverse the phase shift of the transmitted energy passed through said one of the divided delay portions, whereby the phase shift effected by the other of the divided portions of the delay elements produces a net change in phase substantially equal to zero.

2. The method of claim 1 wherein said transmitted energy is a sinusoidally varied electrical signal.

3. The method of claim 2 wherein said electrical signal includes additional frequency components.

4. The method of claim 1 wherein said transmitted energy is an electrical carrier signal that is frequency and/or phase modulated.

5. The method of claim 2 wherein said transmission network further includes a feedback path from the output terminal and summing means for adding the transmitted energy at the input terminal to the energy in the feedback path to perform an integration operation, including the step of: limiting transmission of energy through said feedback path to a feedback factor less than unity.

6. The method of claim 1 wherein said transmission network further includes a feedback path from the output terminal and summing means for adding the transmitted energy at the input terminal to the energy in the feedback path to perform an integration operation, including the step of: limiting transmission of energy through said feedback path to a feedback factor less than unity.

7. The method of claim 1 wherein said transmission network further includes summing means for adding the transmitted energy at the input and output terminals.

8. The method of claim 7 wherein the transmission network still further includes a feedback path for the transmitted energy passed in sequence through the divided delay portions of the energy storing delay elements.

9. The method of claim 2 wherein the input frequency of the transmitted energy is doubled at the input terminal, the subtracting step being performed in series between the divided delay portions of the delay elements.

10. The method of claim 4 wherein the transmitted energy is passed in series through said divided delay portions of the energy storing delay elements, said doubling of the frequency component being performed on the phase shifted transmitted energy conducted between the divided delay portions of the energy storing delay elements.

11. In combination with an energy transmission network having energy storing delay elements between input and output terminals, means interconnecting divided delay portions of the energy storing delay elements for maintaining a substantially constant phase relationship between the transmitted energy at said input and output terminals, comprising means for transmitting the energy at an input frequency in series through said divided delay portions of the energy storing delay elements, frequency multiplier means connected in parallel with one of the divided delay portions for doubling the input frequency of the transmitted energy, and modulator means connected in series with the divided delay portions for subtracting the input frequency of the phase shifted transmitted energy from the doubled frequency to reverse the phase shift effected by only said one of the divided delay portions of the energy storing delay elements, said divided delay portions of the energy storing delay elements thereby producing a net change in phase substantially equal to zero.

12. The combination of claim 11 wherein said one of the divided delay portions of the energy storing delay elements and the frequency multiplier means are connected in parallel to the input terminal and the modulator means is connected in series between the divided delay portions.

13. The combination of claim 11 wherein the transmitted energy includes an additional frequency component, detector means connected in parallel with said constant phase maintaining means for detecting the additional frequency component, and second constant phase maintaining means connected between said detector means and the other of the divided delay portions of the energy storing delay elements for producing a net change in phase with respect to the additional frequency component that is substantially equal to zero.

14. The combination of claim 11 including phase comparing means connected between the input and output terminals for detecting deviations from equal phase of the transmitted energy at the input and output terminals, and timing means connected to the phase comparing means and the divided delay portions for simultaneously adjusting the relative phase shifting effects thereof on the transmitted energy to maintain said zero net change in phase.

15. The combination of claim 11 including summing means for adding the transmitted energy at the input and output terminals.

16. The combination of claim 15 including integrating means for conducting feedback energy from the output terminal to the summing means at a feedback factor less than unity.

17. The combination of claim 16 including means for subtracting the transmitted energy at the input terminal from the transmitted energy at the output terminal.

18. The combination of claim 11 wherein the modulator means is connected in series between said one of the divided delay portions and the output terminal.

19. A method of maintaining a substantially constant phase to frequency relationship between transmitted energy at the input and output terminals of an energy transmission network having signal delay elements, including the steps of: dividing the delay elements into separate delay portions through which the transmitted energy is phase shifted; multiplying the input frequency of the transmitted energy prior to being phase shifted through one of the delay portions; conducting the transmitted energy through a modulator following phase shift through said one of the delay portions with the frequency multiplied energy to produce a reverse phase shift of the transmitted energy at the input frequency; and conducting said transmitted energy through the delay portions in series with the modulator between the input and output terminals.

* * * * *